(12) United States Patent
Jung

(10) Patent No.: US 12,406,972 B2
(45) Date of Patent: Sep. 2, 2025

(54) STACKED OFFSET SEMICONDUCTOR PACKAGE

(71) Applicant: Samsung Electronics Co., Ltd., Suwon-si (KR)

(72) Inventor: Hwan-Wook Jung, Gwangmyeong-si (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 575 days.

(21) Appl. No.: 17/699,931

(22) Filed: Mar. 21, 2022

(65) Prior Publication Data
US 2023/0028252 A1 Jan. 26, 2023

(30) Foreign Application Priority Data
Jul. 21, 2021 (KR) .................. 10-2021-0095363

(51) Int. Cl.
*H01L 25/16* (2023.01)
*H01L 23/00* (2006.01)
*H01L 23/31* (2006.01)

(52) U.S. Cl.
CPC .......... *H01L 25/16* (2013.01); *H01L 23/3128* (2013.01); *H01L 24/06* (2013.01); *H01L 24/48* (2013.01); *H01L 24/49* (2013.01); *H01L 2224/04042* (2013.01); *H01L 2224/48147* (2013.01); *H01L 2224/48227* (2013.01); *H01L 2224/49174* (2013.01)

(58) Field of Classification Search
CPC ..... H01L 25/16; H01L 25/18; H01L 23/3128; H01L 24/06; H01L 24/48; H01L 24/49; H01L 24/33; H01L 24/05; H01L 24/85; H01L 24/32; H01L 24/73; H01L 24/83; H01L 2224/04042; H01L 2224/48227; H01L 2224/49174; H01L 2224/48147; H01L 2924/1431; H01L 25/0652
See application file for complete search history.

(56) References Cited

U.S. PATENT DOCUMENTS 8,970,049 B2   3/2015   Karnezos
9,412,720 B2   8/2016   Nam et al.
(Continued)

FOREIGN PATENT DOCUMENTS

KR   20190099815 A   8/2019

*Primary Examiner* — William B Partridge
*Assistant Examiner* — Gustavo G Ramallo
(74) *Attorney, Agent, or Firm* — Wolf, Greenfield & Sacks, P.C.

(57) ABSTRACT

Disclosed is a semiconductor package comprising a first chip stack including on a substrate a plurality of first semiconductor chips in an offset stack structure and stacked to expose a connection region at a top surface of each of the first semiconductor chips, a second semiconductor chip on the substrate and horizontally spaced apart from the first chip stack, a spacer on the second semiconductor chip, and a second chip stack including third semiconductor chips in an offset stack structure on the first chip stack and the spacer. Each of the first semiconductor chips includes a first chip pad on the connection region and a first wire that extends between the first chip pad and the substrate. The first wire of an uppermost one of the first semiconductor chips is horizontally spaced apart from a lowermost one of the third semiconductor chips.

18 Claims, 10 Drawing Sheets

(56) References Cited

U.S. PATENT DOCUMENTS

| | | |
|---|---|---|
| 10,002,853 B2 | 6/2018 | Oh |
| 10,497,671 B2 | 12/2019 | Cho et al. |
| 10,784,244 B2 | 9/2020 | Han et al. |
| 10,971,479 B2 | 4/2021 | Lee |
| 2002/0180025 A1* | 12/2002 | Miyata ................ H01L 25/0657 257/E29.022 |
| 2003/0127719 A1* | 7/2003 | Chang ................ H01L 25/0657 438/109 |
| 2013/0049228 A1* | 2/2013 | Nam .................... H01L 25/0657 257/777 |
| 2013/0161788 A1* | 6/2013 | Chun ...................... H01L 24/05 257/532 |
| 2017/0170156 A1* | 6/2017 | Hong ................. H01L 25/0652 |
| 2018/0005994 A1* | 1/2018 | Oh ......................... H01L 25/50 |
| 2019/0051634 A1* | 2/2019 | Park .................... H01L 25/0657 |
| 2019/0259742 A1* | 8/2019 | Han ........................ H01L 24/49 |
| 2020/0126919 A1* | 4/2020 | Kang ..................... H01L 23/16 |
| 2021/0082895 A1* | 3/2021 | Miura .................... H01L 24/16 |

* cited by examiner

STACKED OFFSET SEMICONDUCTOR PACKAGE

CROSS-REFERENCE TO RELATED APPLICATION

This U.S. nonprovisional application claims priority under 35 U.S.C § 119 to Korean Patent Application No. 10-2021-0095363 filed on Jul. 21, 2021 in the Korean Intellectual Property Office, the disclosure of which is hereby incorporated by reference in its entirety.

TECHNICAL FIELD

The present inventive concepts relate to a semiconductor package, and more particularly, to a semiconductor package including a stacked integrated circuit.

DISCUSSION OF RELATED ART

A typical stacked package has a structure in which a number of substrates are stacked. For example, the stacked package may include semiconductor chips that are sequentially stacked on a printed circuit board (PCB). Connection pads are formed on the semiconductor chips. Bonding wires may be used to connect the connection pads, such that the semiconductor chips may be electrically coupled to each other. The printed circuit board is provided thereon with a logic chip that controls the semiconductor chips.

Portable devices have been in increasing demand in recent electronic product markets, and as a result, reductions in size and weight of electronic parts mounted on the portable devices are desirable. In order to accomplish the reduction in size and weight of the electronic parts, there is a need for technology to integrate a number of individual devices into a single package as well as technology to reduce individual sizes of mounting parts. In particular, semiconductor packages operated at high frequency signals are required to have compactness and excellent electrical characteristics.

SUMMARY

Some embodiments of present inventive concepts provide a compact-sized semiconductor package.

Some embodiments of the present inventive concepts provide a semiconductor package with increased electrical properties.

According to some embodiments of the present inventive concepts, a semiconductor package may include a first chip stack that includes a plurality of first semiconductor chips on a substrate, the plurality of first semiconductor chips being in an offset stack structure and being stacked to expose a connection region at a top surface of each of the first semiconductor chips, a second semiconductor chip on the substrate and horizontally spaced apart from the first chip stack, a spacer on the second semiconductor chip, and a second chip stack that includes a plurality of third semiconductor chips on the first chip stack and the spacer, the plurality of third semiconductor chips being in an offset stack structure. Each of the plurality of first semiconductor chips may include a first chip pad on the connection region, and a first wire that extends between the first chip pad and the substrate. The first wire of an uppermost one of the first semiconductor chips may be horizontally spaced apart from a lowermost one of the third semiconductor chips.

According to some embodiments of the present inventive concepts, a semiconductor package may include a substrate, a first stack on the substrate, a second stack on the first stack, and a spacer on one side of the first stack and between the substrate and the second stack. The first stack may include a plurality of first semiconductor chips that are stacked on the substrate in ascending stepwise fashion offset in a first direction, a plurality of first wires that extend between the substrate and top surfaces of each of the plurality of first semiconductor chips, and a plurality of first adhesion layers on bottom surfaces of each of the plurality of first semiconductor chips. The second stack may include a plurality of second semiconductor chips that are stacked on the first stack in ascending stepwise fashion offset in a second direction that is different from the first direction, and a plurality of second adhesion layers on bottom surfaces of the plurality of second semiconductor chips. Each of the first wires may include one end coupled to the top surface of one of the plurality of first semiconductor chips, and a wire loop that extends from the end. A level difference between the one end of the first wire and a topmost portion of the wire loop may be greater than a thickness of an adjacent one of the plurality of first adhesion layers.

According to some embodiments of the present inventive concepts, a semiconductor package may include a plurality of first memory chips that are stacked on a substrate in ascending stepwise fashion in a first direction, each of the plurality of first memory chips having a first wire that extends between the substrate and a top surface of the first memory chip, and a first adhesion layer on a bottom surface of the first memory chip. A logic chip may be spaced apart in the first direction from the first memory chips, the logic chip having a second wire that extends between the substrate and a top surface of the logic chip. A spacer may be on the logic chip, the spacer having a second adhesion layer on a bottom surface of the spacer. A plurality of second memory chips may be stacked in ascending stepwise fashion offset in a second direction on the plurality of first memory chips and the spacer, the second direction being different from the first direction. A molding layer may be on the substrate, the molding layer covering the plurality of first memory chips, the logic chip, the spacer, and the second memory chips, and a plurality of external terminals on a bottom surface of the substrate. An entirety of the first wire may be spaced apart from the first adhesion layers adjacent to the first wire. At least a portion of the second wire may be inside the second adhesion layer.

DETAILED DESCRIPTION OF EMBODIMENTS

The following will now describe a semiconductor package according to the present inventive concepts with reference to the accompanying drawings.

Figure 1:
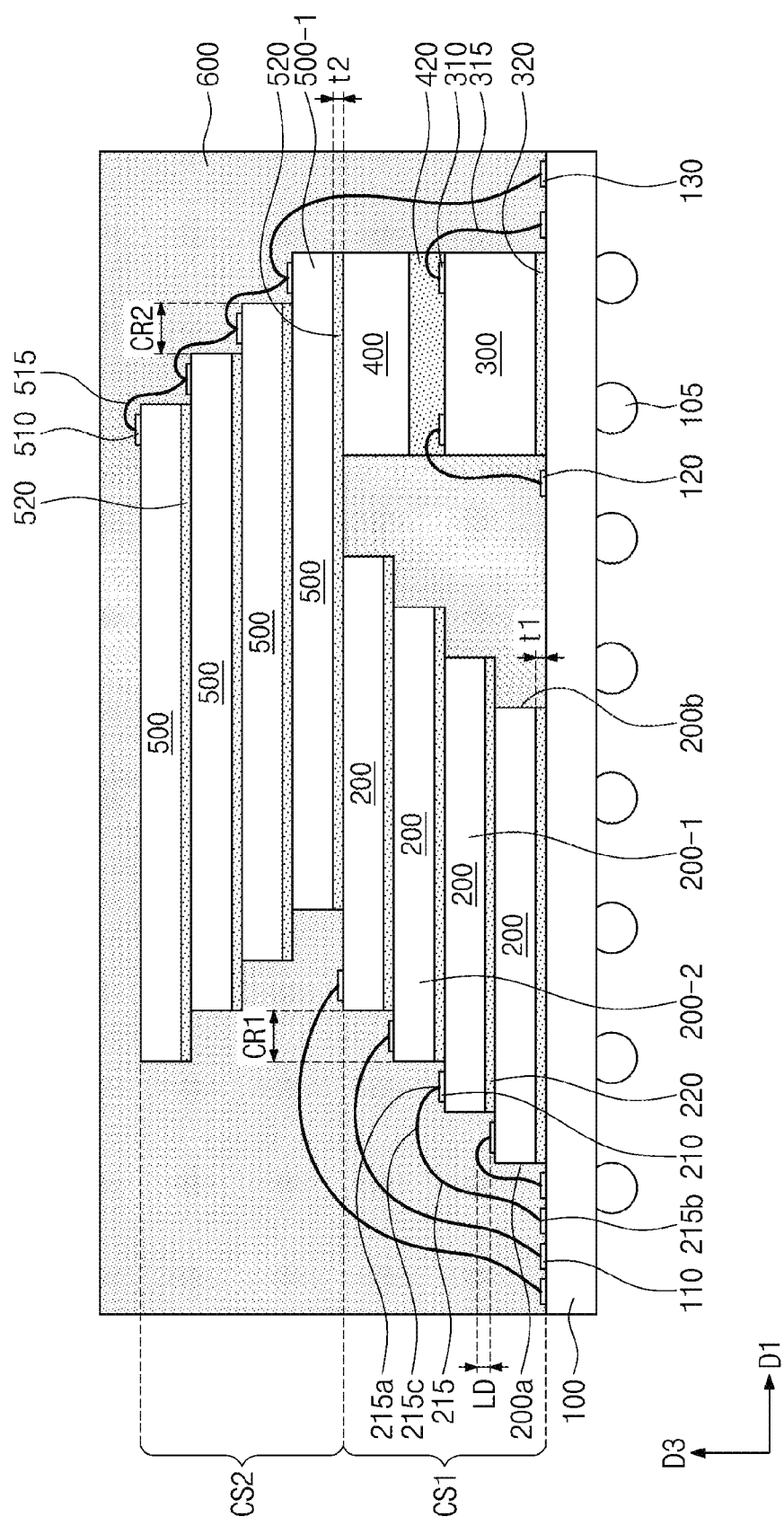
FIGS. 1 and 2 illustrate cross-sectional views of a semiconductor package according to some embodiments of the present inventive concepts.
Figure 2:
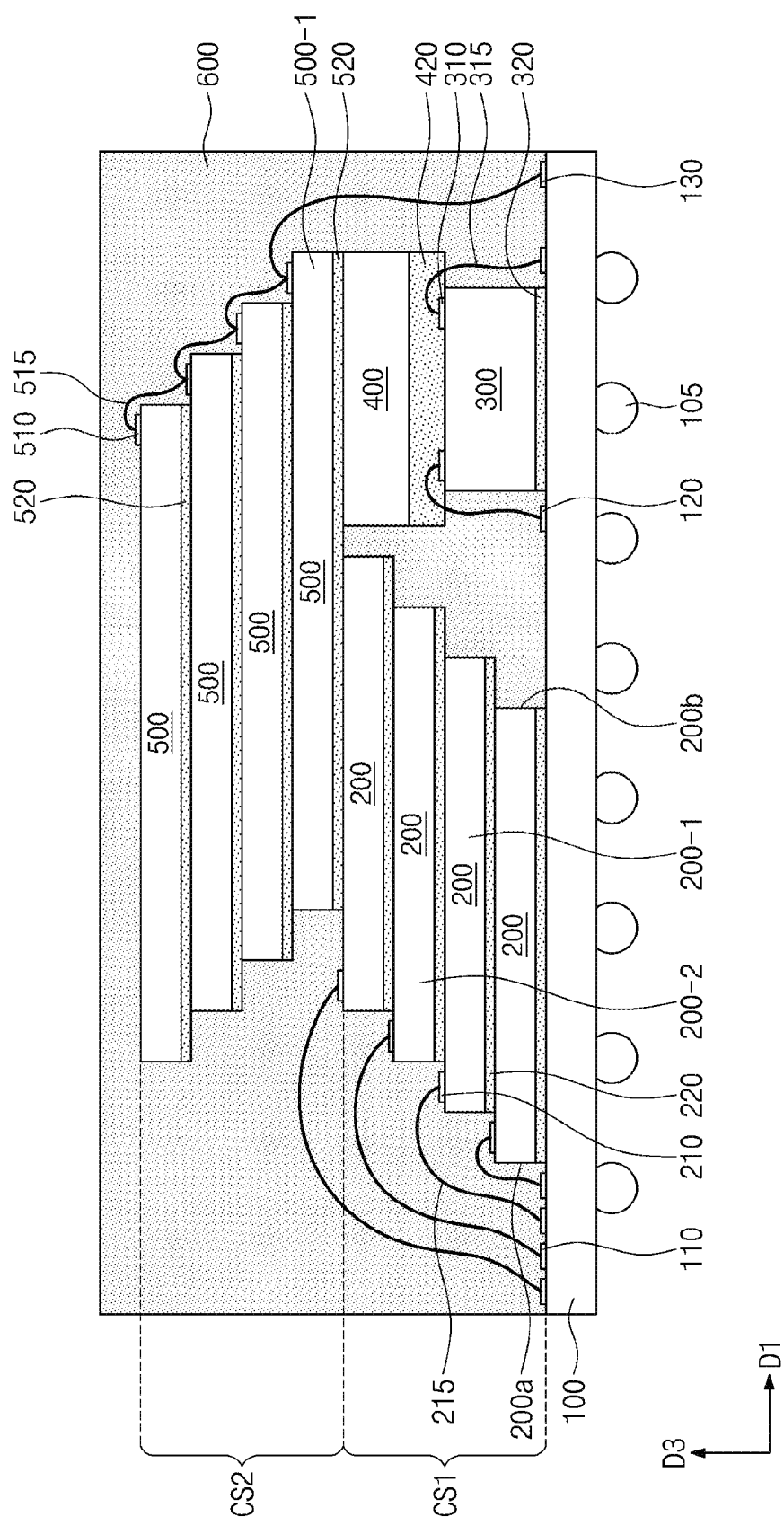
Figure 3:
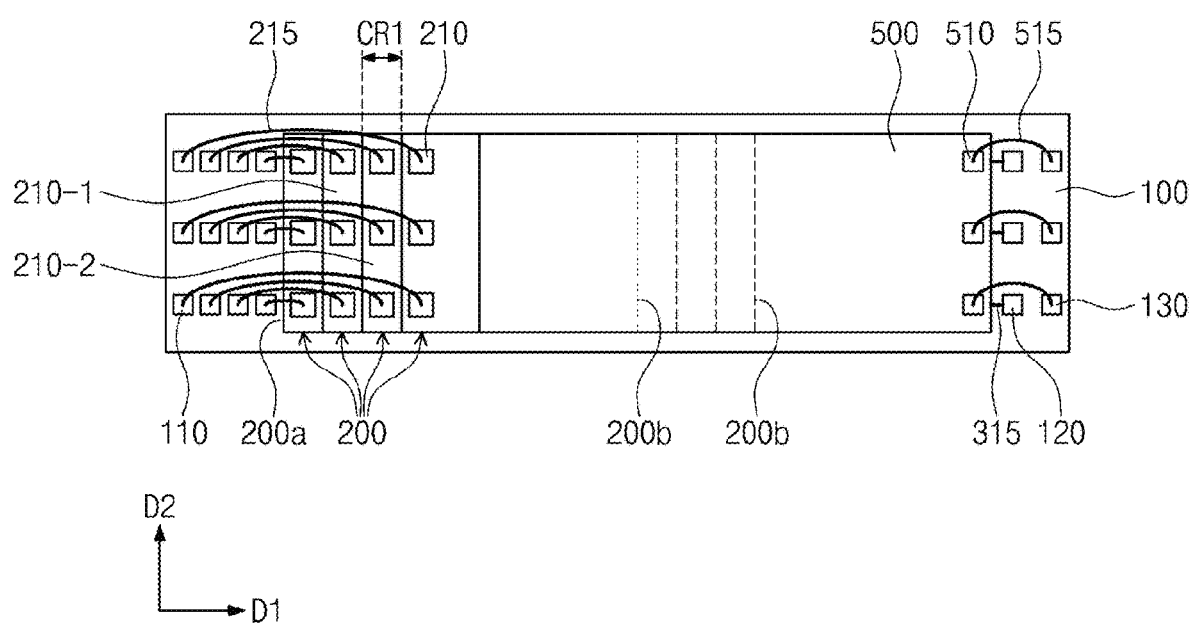
FIG. 3 illustrates a plan view of a semiconductor package according to some embodiments of the present inventive concepts.

FIGS. 1 and 2 illustrate cross-sectional views of a semiconductor package according to some embodiments of the present inventive concepts. FIG. 3 illustrates a plan view of a semiconductor package according to some embodiments of the present inventive concepts. In FIG. 3, for convenience of description, a second chip stack is illustrated to include only one semiconductor chip that is a lowermost one of third semiconductor chips.

Referring to FIGS. 1 and 3, a package substrate 100 may be provided. The package substrate 100 may be a printed circuit board (PCB) having a signal pattern provided on a top surface thereof. The signal pattern may include signal pads 110, 120, and 130. The package substrate 100 may have a structure in which at least one dielectric pattern and at least one wiring pattern are alternately stacked. The package substrate 100 may be provided with external terminals 105 on a bottom surface thereof. The external terminals 105 may include a solder ball, a solder bump, or a solder pad. Based on type of the external terminals 105, the semiconductor package 10 may have a ball grid array (BGA) type, a fine ball-grid array (FBGA) type, or a land grid array (LGA) type.

A first chip stack CS1 may be provided on the package substrate 100. The first chip stack CS1 may include first semiconductor chips 200 that are stacked in a third direction D3 on the package substrate 100. In this description, a first direction D1 and a second direction D2 may be defined as directions that intersect each other while being parallel to a top surface of the package substrate 100, and the third direction D3 may be a direction perpendicular to the top surface of the package substrate 100. The first semiconductor chips 200 may be memory chips. For example, the first semiconductor chips 200 may include a dynamic random-access memory (DRAM). The first semiconductor chips 200 may have a first lateral surface 200a and a second lateral surface 200b that are opposite to each other in the first direction D1. For example, the first lateral surfaces 200a of the first semiconductor chips 200 may be positioned in a direction opposite to the first direction D1, and the second lateral surfaces 200b of the first semiconductor chips 200 may be positioned in the first direction D1. The first semiconductor chips 200 may be in an offset stack structure. For example, the first semiconductor chips 200 may be stacked obliquely in the first direction D1, which may result in an ascending stepwise shape or a cascade shape. For example, each of the first semiconductor chips 200 may protrude in the first direction D1 from an underlying first semiconductor chip 200.

As the first semiconductor chips 200 are stepwise stacked, top surfaces of the first semiconductor chips 200 may be partially exposed. For a single first semiconductor chip 200, a first connection region CR1 may be defined to indicate the exposed portion of the top surface of the first semiconductor chip 200. Stated differently, the first connection region CR1 of a first semiconductor chip 200 may be free from overlap in the third or vertical direction by another of the first semiconductor chips 200. Based on an offset stacking direction of the first semiconductor chips 200, the first connection regions CR1 may be positioned adjacent to the first lateral surfaces 200a of the first semiconductor chips 200. In this description, the expression "offset stacking direction" may be defined to refer to a shift direction relative to an underlying semiconductor chip when semiconductor chips are stacked. For example, in FIG. 1, the first direction D1 may be an offset stacking direction of the first semiconductor chips 200. For convenience of description below, a first sub-semiconductor chip 200-1 may be defined to indicate an underlying first semiconductor chip 200 of arbitrary neighboring first semiconductor chips 200, and a second sub-semiconductor chip 200-2 may be defined to indicate a next overlying first semiconductor chip 200 of arbitrary neighboring first semiconductor chips 200. The first connection region CR1 of the first sub-semiconductor chip 200-1 may be positioned in a direction opposite to the first direction D1 from the second sub-semiconductor chip 200-2. The top surfaces of the first semiconductor chips 200 may be active surfaces of the first semiconductor chips 200. For example, the first semiconductor chips 200 may be provided with first chip pads 210 on the first connection regions CR1 at the top surfaces of the first semiconductor chips 200. The first chip pads 210 may be connected to integrated circuits of the first semiconductor chips 200.

The first semiconductor chips 200 may be wire-bonded to the package substrate 100. The first semiconductor chips 200 may be connected through first connection wires 215 to the package substrate 100. For example, the first connection wires 215 may connect the first chip pads 210 of the first semiconductor chips 200 to first signal pads 110 of the package substrate 100. For example, the first connection wires 215 may each include a first end 215a coupled to the first chip pad 210, a second end 215b coupled to the first signal pad 110, and a wire loop 215c that connects the first end 215a to the second end 215b. When viewed in a plan view, the first signal pads 110 may be positioned in a direction opposite to the first direction D1 from the first chip stack CS1. The first semiconductor chips 200 may be correspondingly provided with first adhesion layers 220 on the bottom surfaces thereof. Each of the first semiconductor chips 200 may be attached thorough the first adhesion layer 220 to an underlying another first semiconductor chip 200. For example, the second sub-semiconductor chip 200-2 may be attached to a top surface of the first sub-semiconductor chip 200-1 through the first adhesion layer 220 provided on a bottom surface of the second sub-semiconductor chip 200-2. In this case, the second sub-semiconductor chip 200-2 may expose the first connection region CR1 of the first sub-semiconductor chip 200-1. A lowermost one (referred to hereinafter as a lowermost first semiconductor chip) of the first semiconductor chips 200 may be attached through the first adhesion layer 220 to the package substrate 100. The first adhesion layer 220 may have a first thickness t1 of about 5 µm to about 30 µm. For example, the first thickness t1 of the first adhesion layer 220 may be equal to or less than about 20 µm. The first adhesion layers 220 may include a die attach film (DAF).

The first connection wires 215 may not be inserted into the first adhesion layers 220. For example, the first chip pad 210 of the first sub-semiconductor chip 200-1 may be spaced apart from the second sub-semiconductor chip 200-2 in a direction opposite to the first direction D1. In such cases, the first chip pad 210 of the first sub-semiconductor chip 200-1 may not be covered with the first adhesion layer 220 of the second sub-semiconductor chip 200-2. The first connection wire 215 of the first sub-semiconductor chip 200-1 may be spaced apart from the second sub-semiconductor chip 200-2 in a direction opposite to the first direction D1. The first connection wire 215 of the first sub-semiconductor chip 200-1 may be spaced apart from the first adhesion layer 220 of the second sub-semiconductor chip 200-2. As the first connection wire 215 is not inserted into the first adhesion layer 220 of the second sub-semiconductor chip 200-2, the first adhesion layer 220 may have a small thickness regardless of placement, length, and an extending direction of the first connection wire 215. For example, a level difference LD between the first end 215a and a topmost portion of the wire loop 215c of the first connection wire 215 coupled to the first chip pad 210 of the first sub-semiconductor chip 200-1 may be greater than the first thickness t1 of the first adhesion layer 220 of the second sub-semiconductor chip 200-2. The level difference LD may mean a difference in height in the third direction D3 from the top surface of the package substrate 100. A range of about 40 μm to about 100 μm may be given as the level difference LD of the first connection wire 215 coupled to the first sub-semiconductor chip 200-1. The first thickness t1 of the first adhesion layer 220 may be equal to or less than about 20 μm.

When the first semiconductor chips 200 of the first chip stack CS1 are vertically stacked, the first chip pad 210 of the first semiconductor chip 200 may be covered with the first adhesion layer 220 of an overlying first semiconductor chip 200. In this case, the first connection wires 215 may extend from inside the first adhesion layers 220 toward outside the first chip stack CS1. Therefore, the first adhesion layers 220 may become thicker as much as heights of the first connection wires 215, which may result in an increase in thickness of the first chip stack CS1.

According to some embodiments of the present inventive concepts, as the first semiconductor chips 200 of the first chip stack CS1 are in an offset stack structure, the first connection wires 215 may not be inserted into adjacent ones of the first adhesion layers 220 and thus the first adhesion layers 220 may have a relatively small thickness. Thus, the first connection wires 215 may be spaced apart from the first adhesion layers. Accordingly, the first chip stack CS1 may decrease in thickness and a semiconductor package may be miniaturized.

Referring still to FIGS. 1 to 3, a second semiconductor chip 300 may be on the package substrate 100. The second semiconductor chip 300 may be spaced apart in the first direction D1 from the first chip stack CS1. For example, the second semiconductor chip 300 may face the second lateral surfaces 200b of the first semiconductor chips 200. The second semiconductor chip 300 may have a thickness greater than those of the first semiconductor chips 200. The thickness of the second semiconductor chip 300 may be less than a total thickness of the first chip stack CS1. A width and planar shape of the second semiconductor chip 300 may be less than those of the first semiconductor chips 200. The present inventive concepts, however, are not limited thereto. The second semiconductor chip 300 may be a logic chip. For example, the second semiconductor chip 300 may include a controller.

The second semiconductor chip 300 may have a top surface as an active surface. For example, the second semiconductor chip 300 may be provided with second chip pads 310 on the top surface thereof. The second chip pads 310 may be connected to an integrated circuit of the second semiconductor chip 300.

The second semiconductor chip 300 may be wire-bonded to the package substrate 100. The second semiconductor chip 300 may be connected through second connection wires 315 to the package substrate 100. For example, the second connection wires 315 may connect the second chip pads 310 of the second semiconductor chip 300 to second signal pads 120 of the package substrate 100. The second signal pads 120 may be positioned either between the first chip stack CS1 and the second semiconductor chip 300 or in the first direction D1 from the second semiconductor chip 300. Alternatively, differently from that shown, the second signal pads 120 may be positioned away from the second semiconductor chip 300 in the second direction D2 or in a direction opposite to the second direction D2.

A second adhesion layer 320 may be provided on a bottom surface of the second semiconductor chip 300. The second semiconductor chip 300 may be attached through the second adhesion layer 320 to the package substrate 100. The second adhesion layer 320 may include a die attach film (DAF).

A spacer 400 may be provided on the second semiconductor chip 300. The spacer 400 may have a width the same as that of the second semiconductor chip 300. The second semiconductor chip 300 and the spacer 400 may be vertically aligned with each other. For example, the second semiconductor chip 300 may have lateral surfaces aligned with those of the spacer 400. According to some embodiments, as shown in FIG. 2, the width of the spacer 400 may be greater than that of the second semiconductor chip 300. In this case, when viewed in a plan view, the spacer 400 may overlap an entirety of the second semiconductor chip 300. Alternatively, the spacer 400 may have a width less than that of the second semiconductor chip 300. In this case, when viewed in a plan view, the second semiconductor chip 300 may overlap an entirety of the spacer 400. The spacer 400 may be provided to compensate (or reduce) a step difference between the first chip stack CS1 and the second semiconductor chip 300. For example, the spacer 400 may have a top surface located at the same level as that of a top surface of the first chip stack CS1 or a top surface of an uppermost one (referred to hereinafter as an uppermost first semiconductor chip) of the first semiconductor chips 200. An interval between the uppermost first semiconductor chip 200 and the spacer 400 may range from about 500 μm to about 5,000 μm. The spacer 400 may include bulk silicon (Si).

The spacer 400 may be attached through a third adhesion layer 420 to the top surface of the second semiconductor chip 300. The third adhesion layer 420 may cover the entirety of the top surface of the second semiconductor chip 300. In such cases, the second chip pads 310 of the second semiconductor chip 300 may be covered with the third adhesion layer 420. The second connection wire 315 may extend from the second chip pad 310 to the second signal pad 120 after passing through a space between the second semiconductor chip 300 and the spacer 400 and over one side of the second semiconductor chip 300. For example, portions of the second connection wires 315 may be inserted into the third adhesion layer 420. The third adhesion layers 420 may include a die attach film (DAF).

To secure a space where the second connection wires 315 are provided, a large interval may be provided between the second semiconductor chip 300 and the spacer 400. For example, the third adhesion layer 420 may have a thickness greater than a level difference between the second chip pad 310 and a topmost portion of the second connection wire 315. The thickness of the third adhesion layer 420 in which the second connection wire 315 is buried may be greater than that of the first adhesion layer 220 in which the first connection wire 215 is not buried. The thickness of the third adhesion layer 420 may range from about 30 μm to about 80 μm.

In some embodiments, when the spacer 400 is provided to have a width less than that of the second semiconductor chip 300, the second chip pads 310 may not be covered with the third adhesion layer 420. In this case, the second connection wires 315 may not be inserted into the third adhesion layer 420. Therefore, the third adhesion layer 420 may have a small thickness. The thickness of the third adhesion layer 420 may range from about 5 μm to about 30 μm.

Referring further to FIGS. 1 to 3, a second chip stack CS2 may be provided on the first chip stack CS1 and the spacer 400.

The second chip stack CS2 may include third semiconductor chips 500 that are stacked on the first chip stack CS1 and the spacer 400. The third semiconductor chips 500 may be memory chips. For example, the third semiconductor chips 500 may include a NAND Flash memory. The third semiconductor chips 500 may be in an offset stack structure. For example, the third semiconductor chips 500 may be stacked obliquely in a direction opposite to the first direction D1, which may result in an ascending stepwise shape or a cascade shape. In this case, each of the third semiconductor chips 500 may protrude in a direction opposite to the first direction D1 from an underlying another third semiconductor chip 500.

As the third semiconductor chips 500 are stepwise stacked, top surfaces of the third semiconductor chips 500 may be partially exposed. For one third semiconductor chip 500, a second connection region CR2 may be defined to indicate the exposed portion of the top surface of the third semiconductor chip 500. Based on an offset stacking direction of the third semiconductor chips 500, the second connection regions CR2 may be positioned adjacent to lateral surfaces positioned in the first direction D1 of the third semiconductor chips 500. The top surfaces of the third semiconductor chips 500 may be active surfaces of the third semiconductor chips 500. For example, the third semiconductor chips 500 may be provided with third chip pads 510 on the second connection regions CR2 at the top surfaces of the third semiconductor chips 500. The third chip pads 510 may be connected to integrated circuits of the third semiconductor chips 500.

The third semiconductor chips 500 may be wire-bonded to the package substrate 100. The third semiconductor chips 500 may be connected through third connection wires 515 to the package substrate 100. For example, the third connection wires 515 may connect to each other the third chip pads 510 of neighboring third semiconductor chips 500. Ones of the third connection wires 515 may connect the third chip pads 510 of a lowermost one of the third semiconductor chips 500 to third signal pads 130 of the package substrate 100. For convenience of description below, a third sub-semiconductor chip 500-1 may be defined to indicate the lowermost one of the third semiconductor chips 500. When viewed in a plan view, the third signal pads 130 may be positioned in the first direction D1 from the second semiconductor chip 300.

The third semiconductor chips 500 may be correspondingly provided with fourth adhesion layers 520 on bottom surfaces thereof. Each of the third semiconductor chips 500 may be attached thorough the fourth adhesion layer 520 to an underlying another third semiconductor chip 500. For example, the third semiconductor chips 500 may be attached to each other through the fourth adhesion layers 520. In such cases, each of the third semiconductor chips 500 may expose the second connection region CR2 of an underlying another third semiconductor chip 500. The third sub-semiconductor chip 500-1 positioned at the bottom of the second chip stack CS2 may be attached through the fourth adhesion layer 520 to the first chip stack CS1 and the spacer 400. The fourth adhesion layer 520 may have a second thickness t2 of about 5 μm to about 30 μm. For example, the second thickness t2 of the fourth adhesion layer 520 may range from about 5 μm to about 10 μm. The fourth adhesion layers 520 may include a die attach film (DAF).

The second chip stack CS2 may be supported by the first chip stack CS1 and the spacer 400. The following will describe arrangement of the first chip stack CS1, the second chip stack CS2, the second semiconductor chip 300, and the spacer 400.

The first chip stack CS1 may be below the third sub-semiconductor chip 500-1. The third sub-semiconductor chip 500-1 may cover a portion of the top surface of the uppermost first semiconductor chip 200 and expose another portion of the top surface of the uppermost first semiconductor chip 200. For example, the third sub-semiconductor chip 500-1 may cover the top surface of the uppermost first semiconductor chip 200 and expose the first connection region CR1 of the uppermost first semiconductor chip 200. The first chip pad 210 of the uppermost first semiconductor chip 200 may be spaced apart in a direction opposite to the first direction D1 from the third sub-semiconductor chip 500-1 and the fourth adhesion layer 520 of the third sub-semiconductor chip 500-1. The first connection wire 215 of the uppermost first semiconductor chip 200 may not be inserted into the fourth adhesion layer 520 of the third sub-semiconductor chip 500-1. Therefore, the fourth adhesion layer 520 may have a small thickness. As a result, it may be possible to provide a compact-sized semiconductor package. The first connection wire 215 of the uppermost first semiconductor chip 200 may have a topmost portion located at a higher level than that of a top surface of the fourth adhesion layer 520 of the third sub-semiconductor chip 500-1.

The third sub-semiconductor chip 500-1 may vertically overlap at least a portion of the lowermost first semiconductor chip 200. As the first semiconductor chips 200 are stacked obliquely in the first direction D1, at least a portion of each of the first semiconductor chips 200 may overlap the third sub-semiconductor chip 500-1. For example, the third sub-semiconductor chip 500-1 may be supported by all of the first semiconductor chips 200.

The second semiconductor chip 300 and the spacer 400 may be below the third sub-semiconductor chip 500-1. The third sub-semiconductor chip 500-1 may overlap an entirety of the second semiconductor chip 300 and an entirety of the spacer 400. The second semiconductor chip 300 and the spacer 400 may be vertically stacked, and the second chip stack CS2 may be supported by an entire top surface of the spacer 400, with the result that the second chip stack CS2 may be strongly supported.

In addition, as the top surface of the spacer 400 has a top surface located at the same level as that of the top surface of the uppermost first semiconductor chip 200, even when the first semiconductor chips 200 are stacked offset in the first direction D1 toward the second chip stack CS2, there may be less or no likelihood that weight of the second chip stack CS2 will cause the first chip stack CS1 to tilt or collapse in the first direction D1. Accordingly, it may be possible to provide a semiconductor package with structural rigidity.

A molding layer 600 may be provided on the package substrate 100. The molding layer 600 may cover the first chip stack CS1, the second semiconductor chip 300, the spacer 400, and the second chip stack CS2. The molding layer 600 may include a dielectric polymeric material, such as epoxy molding compound (EMC).

FIGS. 1 to 3 depict that the first semiconductor chips 200 are stacked obliquely in the first direction D1, but the present inventive concepts are not limited thereto.

Figure 4:
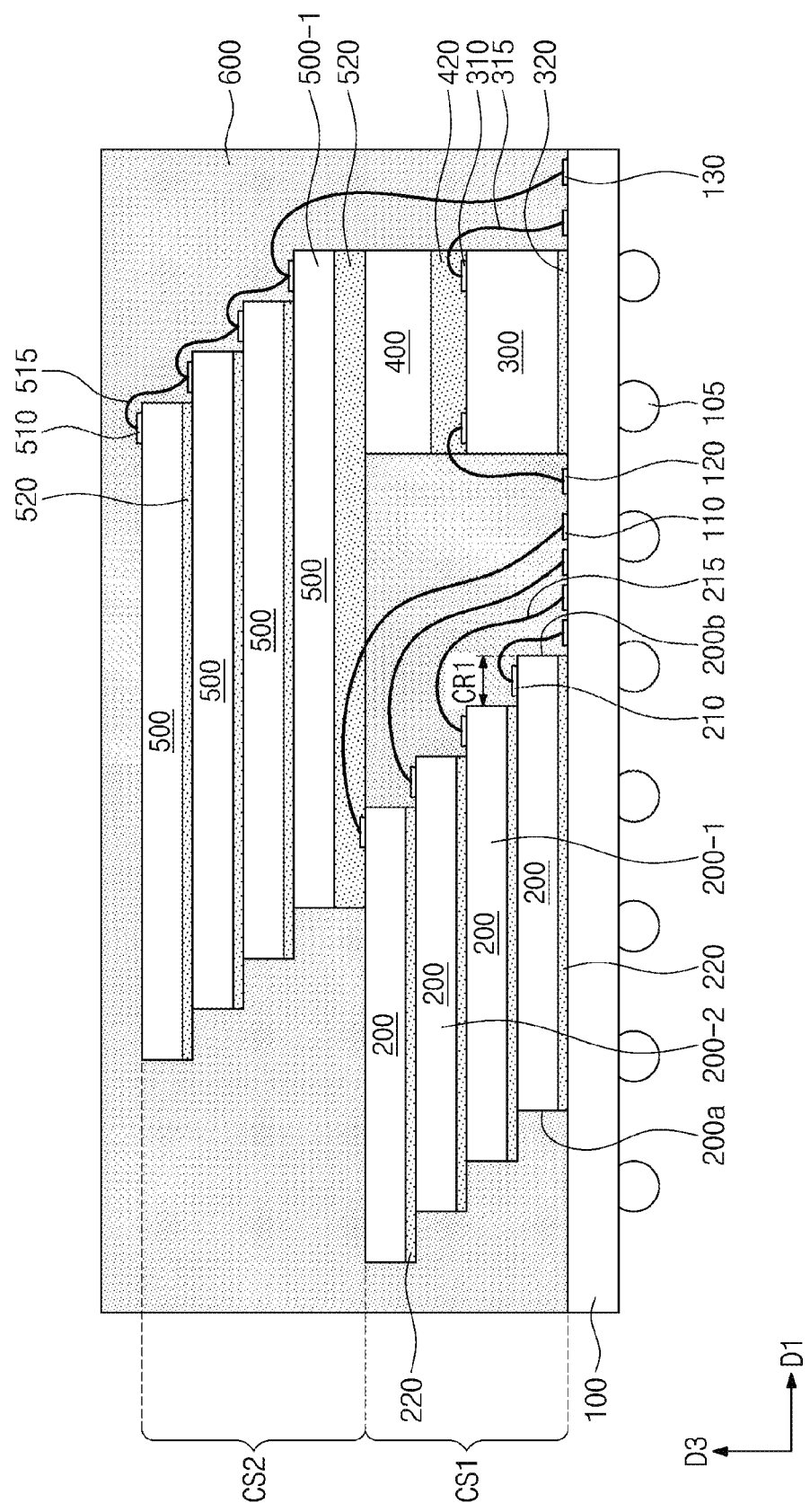
FIGS. 4 and 5 illustrate cross-sectional views of a semiconductor package according to some embodiments of the present inventive concepts.

FIG. 4 illustrates a cross-sectional view of a semiconductor package according to some embodiments of the present inventive concepts. For convenience of description, components the same as those of the embodiments discussed with reference to FIGS. 1 to 3 are allocated the same reference numerals thereto, and a repetitive explanation thereof will be omitted or abridged below. The following description will focus on differences between the embodiments of FIGS. 1 to 3 and other embodiments described below.

Referring to FIG. 4, the first chip stack CS1 may be provided on the package substrate 100. The first chip stack CS1 may include the first semiconductor chips 200 that are stacked in the third direction D3 on the package substrate 100. The first semiconductor chips 200 may be in an offset stack structure. For example, the first semiconductor chips 200 may be stacked obliquely in a direction opposite to the first direction D1, which may result in an ascending stepwise shape or a cascade shape. In this case, the second sub-semiconductor chip 200-2 may protrude in a direction opposite to the first direction D1 from the first sub-semiconductor chip 200-1.

The stepwise stacking of the first semiconductor chips 200 may expose the first connection regions CR1 at the top surfaces of the first semiconductor chips 200. Based on the stacking direction of the first semiconductor chips 200, the first connection regions CR1 may be located adjacent to the second lateral surfaces 200b positioned in the first direction D1 of the first semiconductor chips 200. The first connection region CR1 of the first sub-semiconductor chip 200-1 may be positioned in the first direction D1 from the second sub-semiconductor chip 200-2. The first chip pads 210 may be provided on the first connection regions CR1 at the top surfaces of the first semiconductor chips 200.

The first semiconductor chips 200 may be wire-bonded to the package substrate 100. The first connection wires 215 may connect the first chip pads 210 of the first semiconductor chips 200 to the first signal pads 110 of the package substrate 100. The first signal pads 110 may be positioned in the first direction D1 from the first chip stack CS1.

The second chip stack CS2 may be attached to the first chip stack CS1 and the spacer 400. The third sub-semiconductor chip 500-1 positioned at the bottom of the second chip stack CS2 may be attached through the fourth adhesion layer 520 to the first chip stack CS1 and the spacer 400. In this case, based on an offset stacking direction of the first semiconductor chips 200, the first chip pad 210 of the uppermost first semiconductor chip 200 may be covered with the fourth adhesion layer 520 of the third sub-semiconductor chip 500-1. The first connection wire 215 of the uppermost first semiconductor chip 200 may extend from the first chip pad 210 toward one of the first signal pads 110 after passing through a space, or the fourth adhesion layer 520, between the uppermost first semiconductor chip 200 and the third sub-semiconductor chip 500-1 and over one side of the first chip stack CS1. For example, the first connection wire 215 of the uppermost first semiconductor chip 200 may be partially inserted into the fourth adhesion layer 520 of the third sub-semiconductor chip 500-1.

To secure a space where is provided the first connection wire 215 of the uppermost first semiconductor chip 200, a large interval may be provided between the uppermost first semiconductor chip 200 and the third sub-semiconductor chip 500-1. The thickness of the fourth adhesion layer 520 in which the first connection wire 215 is buried may be greater than that of the first adhesion layer 220 in which the first connection wire 215 is not buried.

According to some embodiments of the present inventive concepts, the first chip stack CS1 and the second semiconductor chip 300 may be provided therebetween with the first signal pads 110 for connection with the first chip stack CS1, and thus a semiconductor package may have a reduced width in the first direction D1. Therefore, a semiconductor package may be miniaturized.

Figure 5:
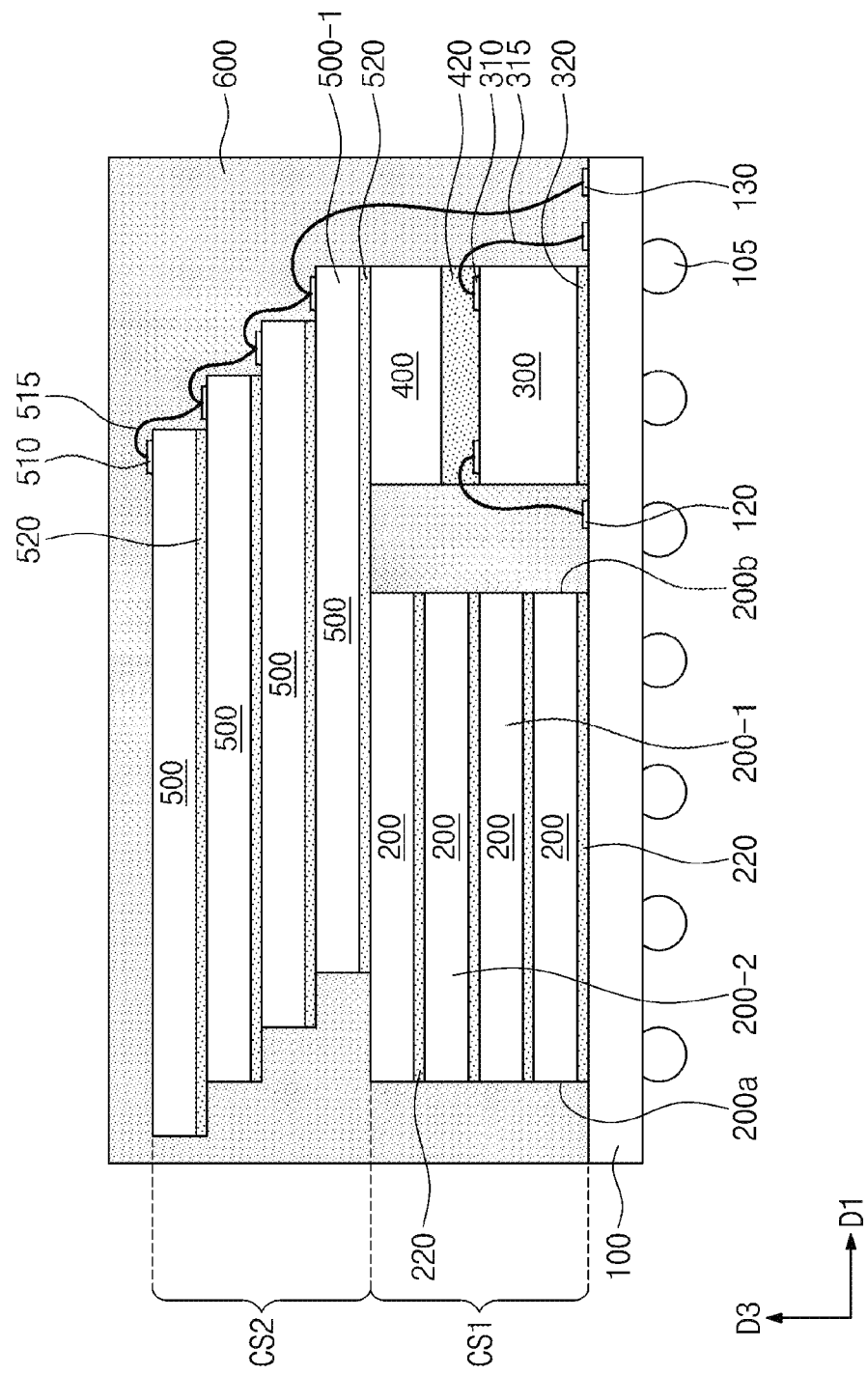
Figure 6:
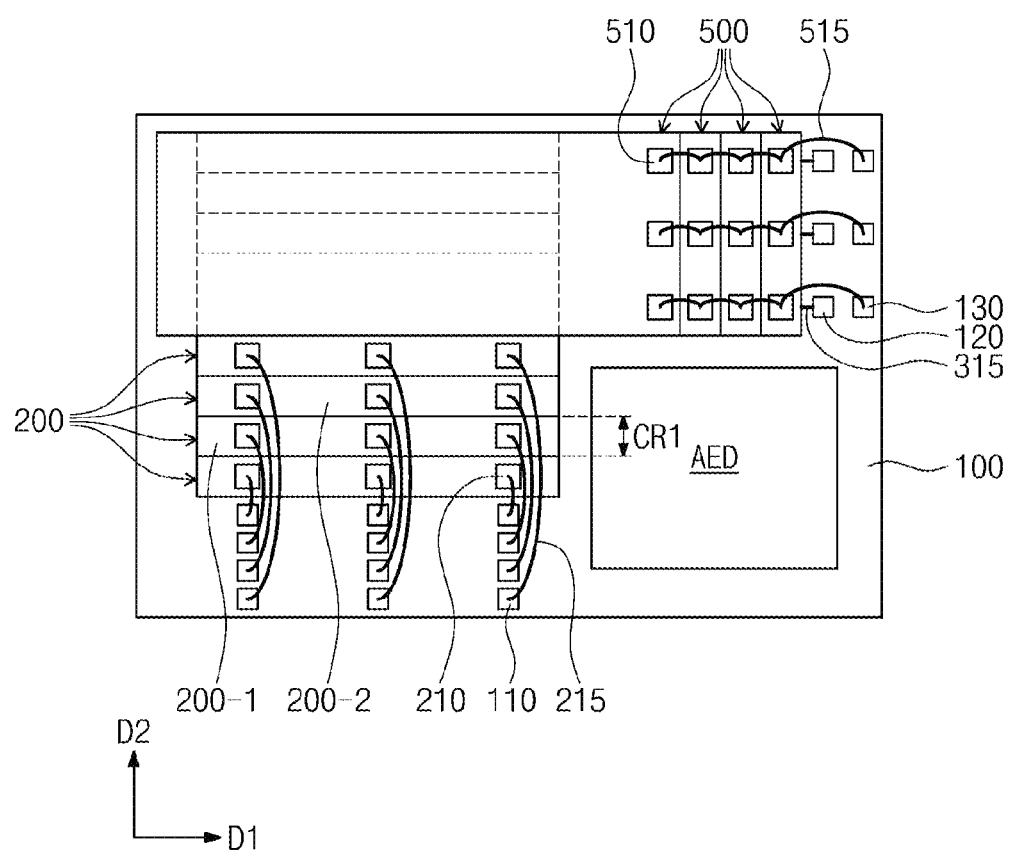
FIG. 6 illustrates a plan view of a semiconductor package according to some embodiments of the present inventive concepts.

FIG. 5 illustrates a cross-sectional view of a semiconductor package according to some embodiments of the present inventive concepts. FIG. 6 illustrates a plan view of a semiconductor package according to some embodiments of the present inventive concepts.

Referring to FIGS. 5 and 6, the first chip stack CS1 may be provided on the package substrate 100. The first chip stack CS1 may include the first semiconductor chips 200 that are stacked in the third direction D3 on the package substrate 100. The first semiconductor chips 200 may be in an offset stack structure. For example, the first semiconductor chips 200 may be stacked obliquely in the first direction D1, which may result in an ascending stepwise shape or a cascade shape. In this case, the second sub-semiconductor chip 200-2 may protrude in the second direction D2 from the first sub-semiconductor chip 200-1.

The stepwise stacking of the first semiconductor chips 200 may expose the first connection regions CR1 at the top surfaces of the first semiconductor chips 200. Based on an offset stacking direction of the first semiconductor chips 200, the first connection region CR1 may be located adjacent to lateral surfaces of the first semiconductor chips 200, which lateral surfaces are positioned in a direction opposite to the second direction D2. The first connection region CR1 of the first sub-semiconductor chip 200-1 may be positioned from the second sub-semiconductor chip 200-2 in a direction opposite to the second direction D2. The first chip pads 210 may be provided on the first connection regions CR1 at the top surfaces of the first semiconductor chips 200.

The first semiconductor chips 200 may be wire-bonded to the package substrate 100. The first connection wires 215 may connect the first chip pads 210 of the first semiconductor chips 200 to the first signal pads 110 of the package substrate 100. The first signal pads 110 may be positioned from the first chip stack CS1 in a direction opposite to the second direction D2.

According to some embodiments of the present inventive concepts, as the first chip stack CS1 is provided to have an offset stacking direction (e.g., the second direction D2) that intersects an offset stacking direction (e.g., the first direction D1) of the second chip stack CS2, a semiconductor package may be free of excessive increase in width in the first direction D1 or the second direction D2. In addition, when viewed in a plan view, an electronic device AED, such as additional semiconductor device or passive device, may be mounted on a region where neither the first chip stack CS1 nor the second chip stack CS2 is provided, and thus a semiconductor package may increase in integration.

Figure 7:
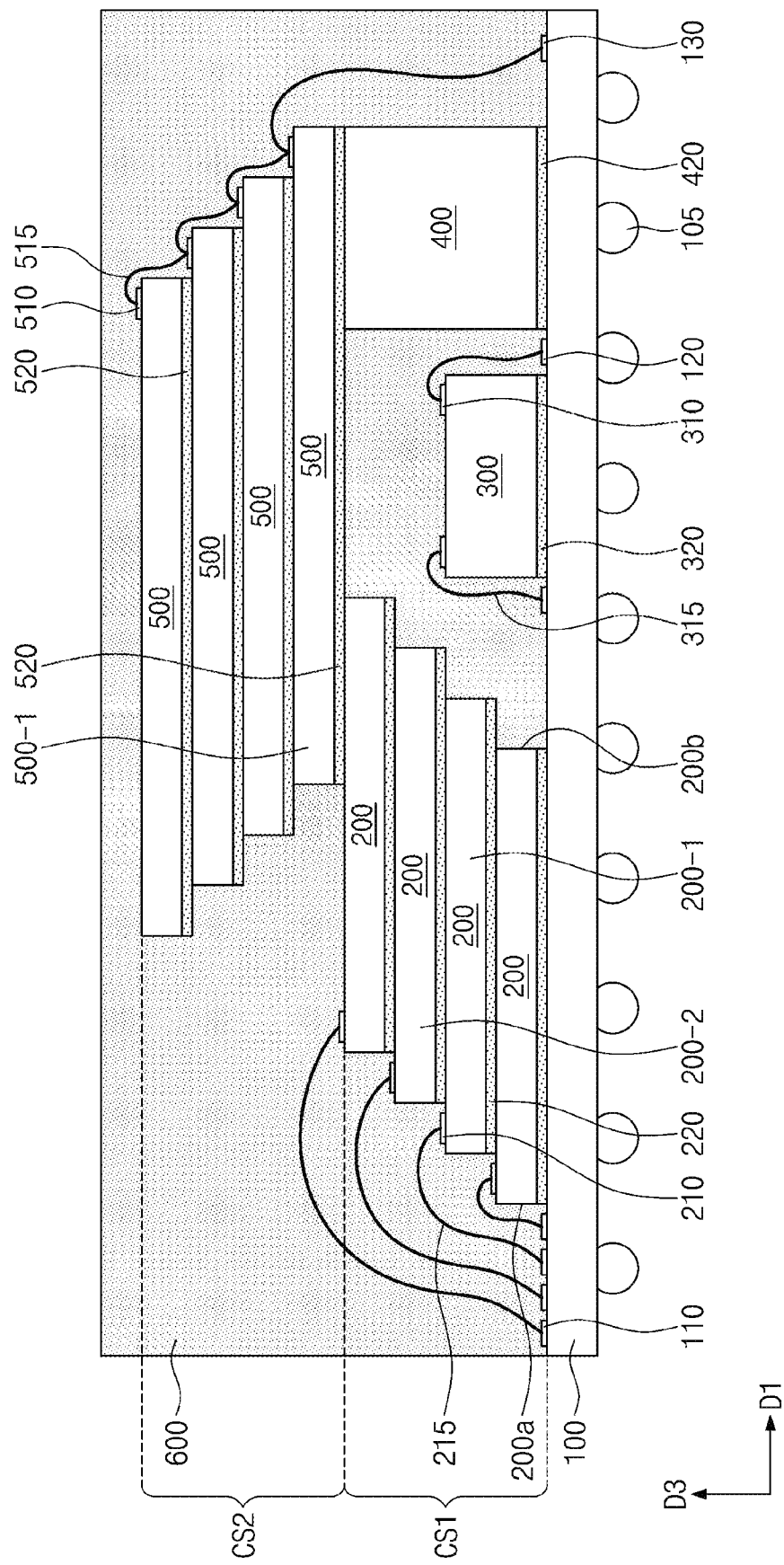
FIGS. 7 and 8 illustrate cross-sectional views of a semiconductor package according to some embodiments of the present inventive concepts.

FIG. 7 illustrates a cross-sectional view of a semiconductor package according to some embodiments of the present inventive concepts.

Referring to FIG. 7, the first chip stack CS1 may be provided on the package substrate 100. The first chip stack CS1 may include the first semiconductor chips 200 that are stacked in the third direction D3 on the package substrate 100. The first semiconductor chips 200 may be in an offset stack structure. For example, the first semiconductor chips 200 may be stacked obliquely in the first direction D1, which may result in an ascending stepwise shape. In such cases, a certain first semiconductor chip 200 may protrude in the first direction D1 from an underlying another first semiconductor chip 200.

The spacer 400 may be on the package substrate 100. The spacer 400 may be spaced apart in the first direction D1 from the first chip stack CS1. For example, the spacer 400 may face the second lateral surfaces 200b of the first semiconductor chips 200. The spacer 400 may have a thickness substantially the same as that of the first chip stack CS1. For example, the top surface of the spacer 400 may be located at the same level as that of the top surface of the first chip stack CS1. The spacer 400 may be attached through the third adhesion layer 420 to the top surface of the package substrate 100.

The second semiconductor chip 300 may be on the package substrate 100. The second semiconductor chip 300 may be between the first chip stack CS1 and the spacer 400. The thickness of the second semiconductor chip 300 may be greater than the thickness of the first semiconductor chip 200 and less than the total thickness of the first chip stack CS1. Based on an offset stacking direction of the first chip stack CS1, the second semiconductor chip 300 may be adjacent to the first chip stack CS1. For example, the second connection wire 315 of the second semiconductor chip 300 may be provided in a space below the uppermost first semiconductor chip 200, or a portion of the second semiconductor chip 300 may be in a space below the uppermost first semiconductor chip 200. According to some embodiments of the present inventive concepts, the second semiconductor chip 300 may be positioned close to the first chip stack CS1, and there may be a reduction in area occupied by the first chip stack CS1 and the second semiconductor chip 300. Therefore, a semiconductor package may be miniaturized.

The second chip stack CS2 may be attached to the first chip stack CS1 and the spacer 400. The third sub-semiconductor chip 500-1 positioned at the bottom of the second chip stack CS2 may be attached through the fourth adhesion layer 520 to the first chip stack CS1 and the spacer 400.

According to some embodiments of the present inventive concepts, the second chip stack CS2 may be supported by the spacer 400 and the first chip stack CS1. For example, on the package substrate 100, the spacer 400 may directly support the second chip stack CS2. Therefore, the second chip stack CS2 may be strongly supported. Thus, a semiconductor package may be provided to have improved structural stability.

Figure 8:
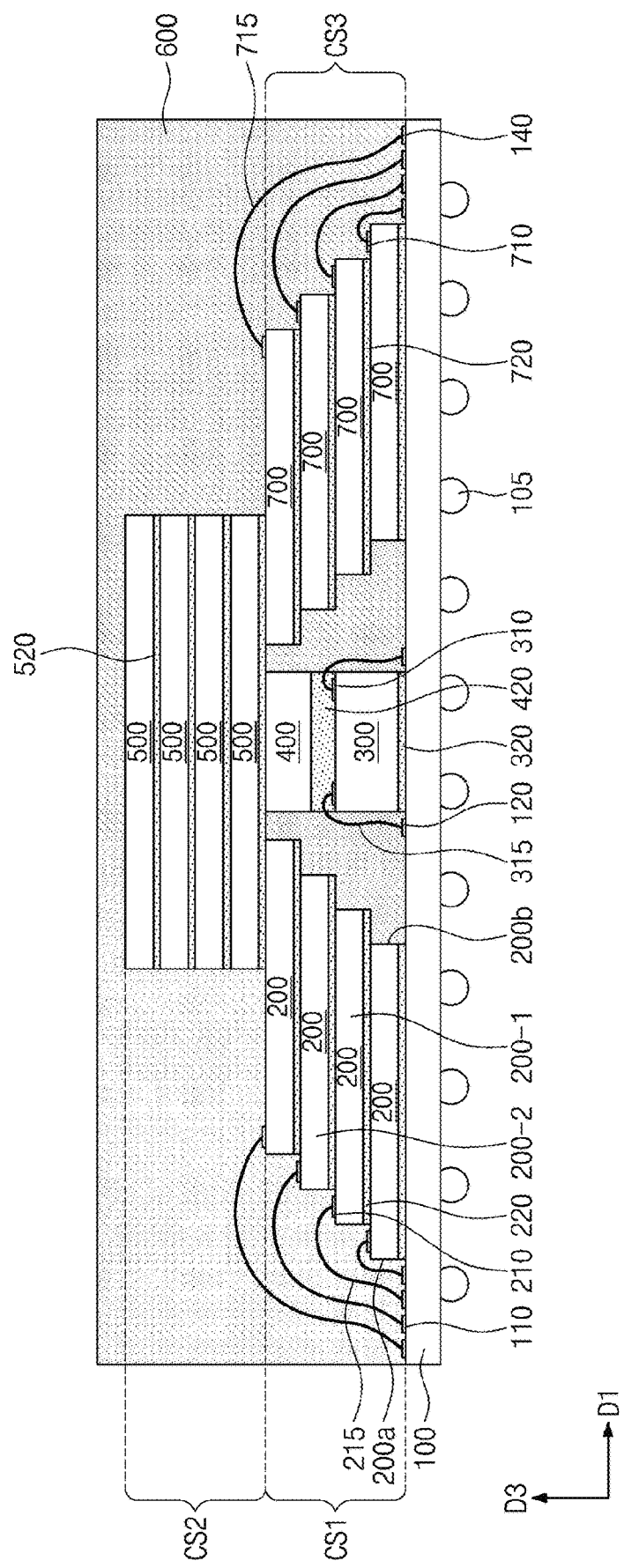
Figure 9:
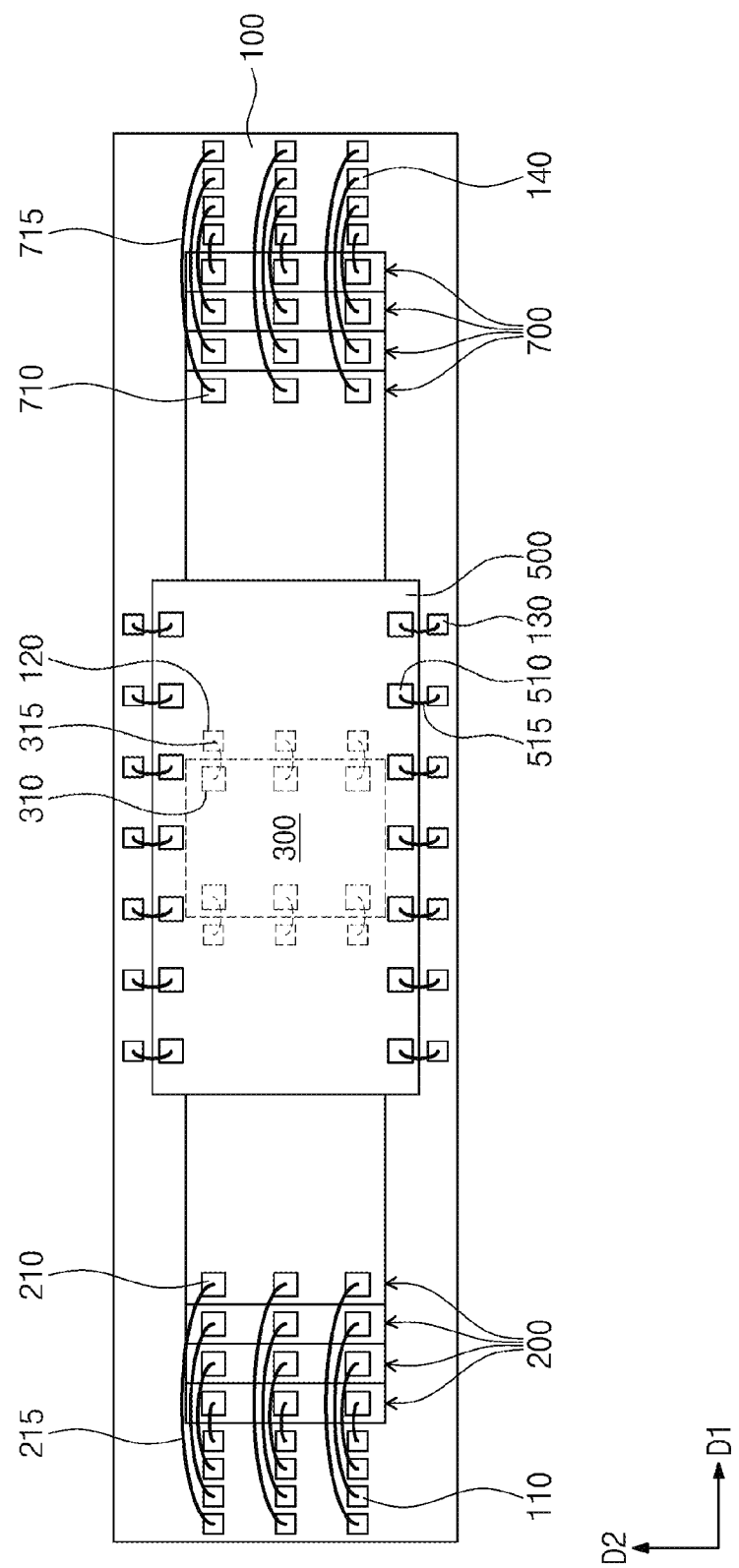
FIG. 9 illustrates a plan view of a semiconductor package according to some embodiments of the present inventive concepts.

FIG. 8 illustrates a cross-sectional view of a semiconductor package according to some embodiments of the present inventive concepts. FIG. 9 illustrates a plan view of a semiconductor package according to some embodiments of the present inventive concepts. In FIG. 9, for convenience of description, a second chip stack is illustrated to include only one semiconductor chip that is a lowermost one of third semiconductor chips.

Referring to FIGS. 8 and 9, the first chip stack CS1 may be provided on the package substrate 100. The first chip stack CS1 may include the first semiconductor chips 200 that are stacked in the third direction D3 on the package substrate 100. The first semiconductor chips 200 may be in an offset stack structure. For example, the first semiconductor chips 200 may be stacked obliquely in the first direction D1, which may result in an ascending stepwise shape. In such cases, a certain first semiconductor chip 200 may protrude in the first direction D1 from an underlying another first semiconductor chip 200.

A third chip stack CS3 may be provided on the package substrate 100. The third chip stack CS3 may be positioned in the first direction D1 from the first chip stack CS1. The third chip stack CS3 may include fourth semiconductor chips 700 that are stacked in the third direction D3 on the package substrate 100. The fourth semiconductor chips 700 may be memory chips. For example, the fourth semiconductor chips 700 may include a dynamic random-access memory (DRAM).

The fourth semiconductor chips 700 may be in an offset stack structure. For example, the fourth semiconductor chips 700 may be stacked obliquely in a direction opposite to the first direction D1, which may result in an ascending stepwise shape or a cascade shape. In such cases, each of the fourth semiconductor chips 700 may protrude in a direction opposite to the first direction D1 from an underlying another fourth semiconductor chip 700. Such configuration may cause that an interval between the first semiconductor chips 200 and the fourth semiconductor chips 700 may decrease with increasing distance from the package substrate 100. The present inventive concepts, however, are not limited thereto, and an offset stacking direction of the fourth semiconductor chips 700 may not be opposite to that of the first semiconductor chips 200. For example, the fourth semiconductor chips 700 may be stacked obliquely in the first direction D1 or in the second direction D2. The third chip stack CS3 may have a top surface located at the same level as that of the top surface of the first chip stack CS1.

The stepwise stacking of the fourth semiconductor chips 700 may expose partial regions at top surfaces of the fourth semiconductor chips 700. Based on an offset stacking direction of the fourth semiconductor chips 700, the exposed partial regions may be adjacent to lateral surfaces positioned in the first direction D1 of the fourth semiconductor chips 700. The fourth semiconductor chips 700 may be provided with fourth chip pads 710 on the exposed partial regions.

The fourth semiconductor chips 700 may be wire-bonded to the package substrate 100. A plurality of fourth connection wires 715 may connect the fourth chip pads 710 of the fourth semiconductor chips 700 to fourth signal pads 140 of the package substrate 100. The fourth signal pads 140 may be positioned in the first direction D1 from the third chip stack CS3.

The fourth semiconductor chips 700 may be provided with fifth adhesion layers 720 on bottom surfaces thereof. Each of the fourth semiconductor chips 700 may be attached through the fifth adhesion layer 720 to an underlying another fourth semiconductor chip 700. A lowermost one of the fourth semiconductor chips 700 may be attached through the fifth adhesion layer 720 to the package substrate 100. The fifth adhesion layers 720 may include a die attach film (DAF).

The second semiconductor chip 300 may be on the package substrate 100. The second semiconductor chip 300 may be between the first chip stack CS1 and the third chip stack CS3. The thickness of the second semiconductor chip 300 may be greater than the thickness of the first semiconductor chip 200 and less than the total thickness of the first chip stack CS1. Based on an offset stacking direction of the first chip stack CS1 and of the third chip stack CS3, the second semiconductor chip 300 may be adjacent to the first chip stack CS1 and the third chip stack CS3. For example, the second connection wires 315 of the second semiconductor chip 300 may be provided in a space below the uppermost first semiconductor chip 200 or an uppermost fourth semiconductor chip 700, or a portion of the second semiconductor chip 300 may be in a space below the uppermost first semiconductor chip 200 or the uppermost fourth semiconductor chip 700. The second semiconductor chip 300 may be attached through the second adhesion layer 320 to the package substrate 100.

According to some embodiments of the present inventive concepts, a plurality of chip stacks CS1, CS2, and CS3 may be provided to increase integration of a semiconductor package, and in addition an area occupied by the first chip stack CS1, the second chip stack CS2, and the third chip stack CS3 may be small to reduce a size of the semiconductor package.

The spacer 400 may be provided on the second semiconductor chip 300. The spacer 400 may have a width equal to or less than that of the second semiconductor chip 300. The spacer 400 may be provided to compensate (or reduce) a step difference between the second semiconductor chip 300 and each of the first and third chip stacks CS1 and CS3. For example, the spacer 400 may have a top surface located at the same level as that of a top surface of the first chip stack CS1 (or a top surface of the uppermost first semiconductor chip 200) and that of a top surface of the third chip stack CS3 (or a top surface of the uppermost fourth semiconductor chip 700). The spacer 400 may be attached through the third adhesion layer 420 to the top surface of the second semiconductor chip 300.

The second chip stack CS2 may be provided on the first chip stack CS1, the third chip stack CS3, and the spacer 400. The second chip stack CS2 may include the third semiconductor chips 500 that are stacked in the third direction D3 on the first chip stack CS1, the third chip stack CS3, and the spacer 400. The third semiconductor chips 500 may be in an offset stack structure. For example, the third semiconductor chips 500 may be stacked obliquely in the second direction D2 or in a direction opposite to the second direction D2, which may result in an ascending stepwise shape. According to some embodiments, the third semiconductor chips 500 may be stacked vertically aligned with each other.

The stepwise stacking of the third semiconductor chips 500 may expose partial regions at top surfaces of the third semiconductor chips 500. The third chip pads 510 may be provided on the exposed partial regions of the third semiconductor chips 500.

The third semiconductor chips 500 may be wire-bonded to the package substrate 100. The third connection wires 515 may connect the third chip pads 510 of the third semiconductor chips 500 to the third signal pads 130 of the package substrate 100. The third signal pads 130 may be positioned from the second chip stack CS2 in the second direction D2 or in a direction opposite to the second direction D2.

The second chip stack CS2 may be attached to the first chip stack CS1, the third chip stack CS3, and the spacer 400. The third sub-semiconductor chip 500-1 positioned at the bottom of the second chip stack CS2 may be attached through the fourth adhesion layer 520 to the first chip stack CS1, the third chip stack CS3, and the spacer 400. In this case, based on a stacking direction of the fourth semiconductor chips 700, the fourth chip pad 710 of the uppermost fourth semiconductor chip 700 may not be covered with the fourth adhesion layer 520 of the third sub-semiconductor chip 500-1. The fourth connection wire 715 of the uppermost fourth semiconductor chip 700 may not be inserted into the fourth adhesion layer 520 of the third sub-semiconductor chip 500-1. Therefore, the fourth adhesion layer 520 may have a small thickness. Therefore, a semiconductor package may be miniaturized.

The third sub-semiconductor chip 500-1 may vertically overlap at least a portion of the lowermost first semiconductor chip 200 and at least a portion of the lowermost fourth semiconductor chip 700. For example, the second chip stack CS2 may be supported by all the first semiconductor chips 200 and all the fourth semiconductor chips 700.

The third sub-semiconductor chip 500-1 may be supported by the spacer 400 positioned between the first chip stack CS1 and the third chip stack CS3. Therefore, even when the first semiconductor chips 200 and the fourth semiconductor chips 700 are stacked offset toward each other, there may be less or no likelihood that weight of the second chip stack CS2 will cause the first and third chip stacks CS1 and CS3 to collapse toward each other. Accordingly, it may be possible to provide a semiconductor package with structural rigidity.

Figure 10:
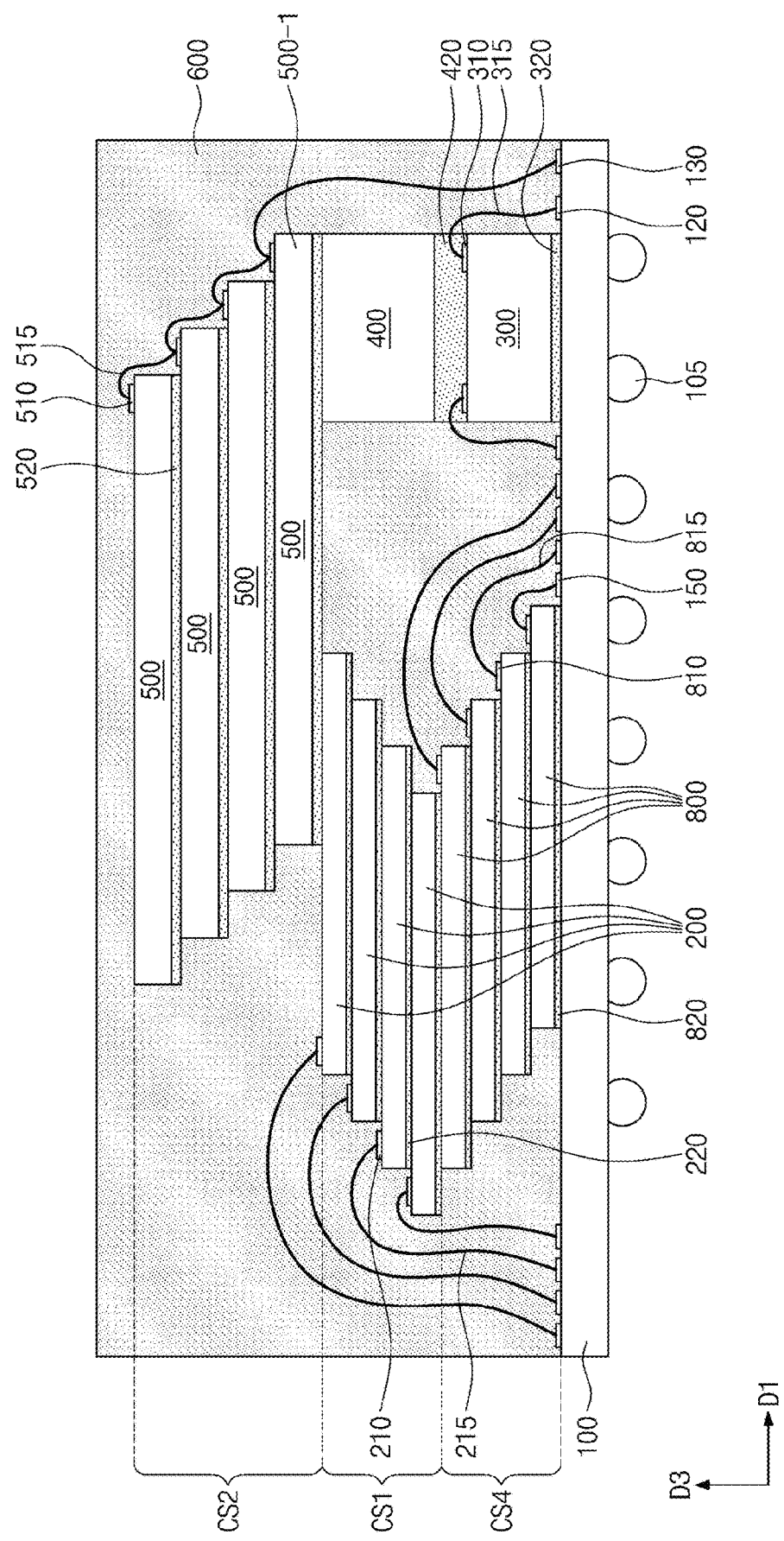
FIG. 10 illustrates a cross-sectional view of a semiconductor package according to some embodiments of the present inventive concepts.

FIG. 10 illustrates a cross-sectional view of a semiconductor package according to some embodiments of the present inventive concepts.

Referring to FIG. 10, a fourth chip stack CS4 may be provided between the package substrate 100 and the first chip stack CS1. The fourth chip stack CS4 may include fifth semiconductor chips 800 that are stacked in the third direction D3 on the package substrate 100. The fifth semiconductor chips 800 may be in an offset stack structure. For example, an offset stacking direction of the fifth semiconductor chips 800 may be opposite to that of the first semiconductor chips 200. For example, the fifth semiconductor chips 800 may be stacked obliquely in a direction opposite to the first direction D1, which may result in an ascending stepwise shape. In such cases, a certain fifth semiconductor chip 800 may protrude in a direction opposite to the first direction D1 from an underlying another fifth semiconductor chip 800.

The stepwise stacking of the fifth semiconductor chips 800 may expose partial regions at top surfaces of the fifth semiconductor chips 800. Based on an offset stacking direction of the fifth semiconductor chips 800, the exposed partial regions may be adjacent to lateral surfaces positioned in the first direction D1 of the fifth semiconductor chips 800. The fifth semiconductor chips 800 may be provided with fifth chip pads 810 on the exposed partial regions.

The fifth semiconductor chips 800 may be wire-bonded to the package substrate 100. A plurality of fifth connection wires 815 may connect the fifth chip pads 810 of the fifth semiconductor chips 800 to fifth signal pads 150 of the package substrate 100. The fifth signal pads 150 may be positioned in the first direction D1 from the fourth chip stack CS4.

The fifth semiconductor chips 800 may be provided with sixth adhesion layers 820 on bottom surfaces thereof. Each of the fifth semiconductor chips 800 may be attached through the sixth adhesion layer 820 to an underlying another fifth semiconductor chip 800. A lowermost one of the fifth semiconductor chips 800 may be attached through the sixth adhesion layer 820 to the package substrate 100. The sixth adhesion layers 820 may include a die attach film (DAF).

The first chip stack CS1 may be on an uppermost fifth semiconductor chip 800. The first chip stack CS1 may include the first semiconductor chips 200 that are stacked in the third direction D3 on the fourth chip stack CS4. The first semiconductor chips 200 may be in an offset stack structure. For example, the first semiconductor chips 200 may be stacked obliquely in the first direction D1, which may result in an ascending stepwise shape. In such cases, the lowermost first semiconductor chip 200 may overlap at least a portion of the lowermost fifth semiconductor chip 800. Thus, the first chip stack CS1 may be supported by all the fifth semiconductor chips 800.

The second chip stack CS2 may be attached to the first chip stack CS1 and the spacer 400. The third sub-semiconductor chip 500-1 positioned at the bottom of the second chip stack CS2 may be attached through the fourth adhesion layer 520 to the first chip stack CS1 and the spacer 400.

The third sub-semiconductor chip 500-1 may vertically overlap at least a portion of the lowermost first semiconductor chip 200 and at least a portion of the lowermost fifth semiconductor chip 800. For example, the second chip stack CS2 may be supported by all the first semiconductor chips 200 and all the fifth semiconductor chips 800, and accordingly it may be possible to provide a semiconductor package with structural rigidity.

For a semiconductor package according to some embodiments of the present inventive concepts, as semiconductor chips of a lower chip stack are in an offset stack structure, connection wires of the lower chip stack may not be inserted into adhesion layers, and thus the adhesion layers may have their small thicknesses. Accordingly, the lower chip stack may decrease in thickness and the semiconductor package may be miniaturized.

In addition, as a spacer has a top surface located at the same level as that of a top surface of the lower chip stack, even when semiconductor chips of the lower chip stack are stacked offset in one direction, there may be less or no likelihood that weight of an upper chip stack will cause the lower chip stack to collapse in the one direction. Thus, the semiconductor package may be provided to have improved structural stability.

Although the present inventive concepts have been described in connection with the embodiments of the present inventive concepts illustrated in the accompanying drawings, it will be understood by one of ordinary skill in the art that variations in form and detail may be made therein without departing from the spirit and essential feature of the present inventive concepts. The above disclosed embodiments should thus be considered illustrative and not restrictive.

What is claimed is:

1. A semiconductor package, comprising:
a first chip stack that includes a plurality of first semiconductor chips on a substrate, the plurality of first semiconductor chips is in an offset stack structure and stacked such that a connection region is exposed at a top surface of each of the plurality of first semiconductor chips;
a second semiconductor chip on the substrate and horizontally spaced apart from the first chip stack;
a spacer on the second semiconductor chip; and
a second chip stack that includes a plurality of third semiconductor chips on the first chip stack and the spacer, the plurality of third semiconductor chips is in an offset stack structure,
wherein each of the plurality of first semiconductor chips includes:
a first chip pad on the connection region; and
a first wire that extends between the first chip pad and the substrate,
wherein the first wire of an uppermost one of the plurality of first semiconductor chips is horizontally spaced apart from a lowermost one of the plurality of third semiconductor chips
wherein the plurality of first semiconductor chips that are vertically adjacent to each other are attached to each other through a plurality of first adhesion layers provided on bottom surfaces of the plurality of first semiconductor chips wherein:
the spacer is attached through a second adhesion layer to a top surface of the second semiconductor chip,
the second semiconductor chip has a second wire that extends between the second semiconductor chip and the substrate from the top surface of the second semiconductor chip, a portion of the second wire being positioned in the second adhesion layer under the spacer, and
a thickness of the second adhesion layer is greater than a thickness of one of the plurality of first adhesion layers.

2. The semiconductor package of claim 1, wherein the first wire of each of the plurality of first semiconductor chips is not inserted into the plurality of first adhesion layers.

3. The semiconductor package of claim 1, wherein the first wire of each of the plurality of first semiconductor chips includes:
a first end coupled to the first chip pad;
a second end coupled to the substrate; and
a wire loop that connects the first end and the second end to each other,
wherein a level difference between the first end and a topmost portion of the wire loop is greater than a thickness of one of the plurality of first adhesion layers.

4. The semiconductor package of claim 1, wherein
the thickness of one of the plurality of first adhesion layers is in a range of about 5 µm to about 20 µm, and
the thickness of the second adhesion layer is in a range of about 30 µm to about 80 µm.

5. The semiconductor package of claim 1, wherein the second chip stack is attached through a third adhesion layer to a top surface of the first chip stack and to a top surface of the spacer.

6. The semiconductor package of claim 5, wherein a topmost portion of the first wire of the uppermost one of the plurality of first semiconductor chips is at a level higher than a level of a top surface of the third adhesion layer.

7. The semiconductor package of claim 1, wherein the plurality of first semiconductor chips are stacked on the substrate in ascending stepwise fashion offset in a first direction toward the second semiconductor chip.

8. The semiconductor package of claim 7, wherein
the connection region is adjacent to one lateral surface in a second direction of one of the plurality of first semiconductor chips, the second direction being opposite to the first direction, and
the first wire extends from the connection region of one of the plurality of first semiconductor chips toward one side in the second direction of the plurality of first semiconductor chips and has a coupling to a substrate pad of the substrate.

9. The semiconductor package of claim 1, wherein the plurality of first semiconductor chips are stacked on the substrate in ascending stepwise fashion in a third direction away from the second semiconductor chip.

10. The semiconductor package of claim 9, wherein
the connection region is adjacent to one lateral surface in a fourth direction of the plurality of first semiconductor chips, the fourth direction being opposite to the third direction, and
the first wire extends between the connection region of one of the plurality of first semiconductor chips and a space between the first chip stack and the second semiconductor chip and has coupling to a substrate pad of the substrate.

11. The semiconductor package of claim 1, wherein the lowermost one of the plurality of third semiconductor chips vertically overlaps an entirety of the second semiconductor chip and overlaps at least a portion of a lowermost one of the plurality of first semiconductor chips.

12. A semiconductor package, comprising:
a substrate and a plurality of spaced apart signal pads on the substrate;
a first stack on the substrate;
a second stack on the first stack; and
a spacer on one side of the first stack and between the substrate and the second stack,
wherein the first stack includes:
a plurality of first semiconductor chips that are stacked on the substrate in ascending stepwise fashion offset in a first direction;
a plurality of first wires that extend between the substrate and top surfaces of each of the plurality of first semiconductor chips; and
a plurality of first adhesion layers on bottom surfaces of each of the plurality of first semiconductor chips,
wherein the second stack includes:
a plurality of second semiconductor chips that are stacked on the first stack in ascending stepwise fashion offset in a second direction, the second direction being different from the first direction; and
a plurality of second adhesion layers on bottom surfaces of the second semiconductor chips,
wherein each of the first wires includes:
a first end coupled to the top surface of a respective one of the plurality of first semiconductor chips;
a wire loop that extends from the first end; and
a second end coupled to a respective one of the plurality of spaced apart signal pads on the substrate,
wherein a level difference between the first end of the first wire and a topmost portion of the wire loop is greater than a thickness of an adjacent one of the plurality of first adhesion layers.

13. The semiconductor package of claim 12, wherein the second direction is opposite the first direction, and the first wire is coupled to one of the plurality of first semiconductor chips and is spaced apart in the second direction from another of the plurality of first semiconductor chips, the another of the plurality of first semiconductor chips being attached to the one of the plurality of first semiconductor chips.

14. The semiconductor package of claim 12, wherein a top surface of an uppermost one of the plurality of first semiconductor chips is at a level the same as a level of a top surface of the spacer.

15. The semiconductor package of claim 12, further comprising a third semiconductor chip between the substrate and the spacer,
wherein the spacer is attached to the third semiconductor chip through a third adhesion layer provided on a bottom surface of the spacer, and
wherein the third semiconductor chip has a second wire that extends between the substrate and a top surface of the third semiconductor chip, a portion of the second wire extending into the third adhesion layer.

16. The semiconductor package of claim 15, wherein a thickness of the third adhesion layer is greater than the thickness of ones of the plurality of first adhesion layers and greater than a thickness of ones of the plurality of second adhesion layers, and the level difference between the first end of the first wire and a topmost portion of the wire loop is greater than a thickness of ones of the plurality of second adhesion layers.

17. A semiconductor package, comprising:
a plurality of first memory chips that are stacked on a substrate in ascending stepwise fashion offset in a first direction, each of the plurality of first memory chips having
a first wire that extends between the substrate and a top surface of the first memory chip, and
a first adhesion layer on a bottom surface of the first memory chip;
a logic chip that is spaced apart in the first direction from the plurality of first memory chips, the logic chip having a second wire that extends between the substrate and a top surface of the logic chip;
a spacer on the logic chip, the spacer having a second adhesion layer on a bottom surface of the spacer;
a plurality of second memory chips that are stacked in ascending stepwise fashion offset in a second direction on the plurality of first memory chips and the spacer, the second direction being different from the first direction;
a molding layer on the substrate, the molding layer covering the plurality of first memory chips, the logic chip, the spacer, and the second memory chips; and
a plurality of external terminals on a bottom surface of the substrate,
wherein an entirety of the first wire is spaced apart from the first adhesion layers adjacent to the first wire, and
wherein at least a portion of the second wire is inside the second adhesion layer and under the spacer.

18. The semiconductor package of claim 17, wherein a thickness of the first adhesion layer is less than a thickness of the second adhesion layer.

* * * * *